(12) United States Patent
Uejima

(10) Patent No.: US 11,356,132 B2
(45) Date of Patent: *Jun. 7, 2022

(54) RADIO FREQUENCY MODULE AND COMMUNICATION DEVICE

(71) Applicant: Murata Manufacturing Co., Ltd., Nagaokakyo (JP)

(72) Inventor: Takanori Uejima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/114,504

(22) Filed: Dec. 8, 2020

(65) Prior Publication Data

US 2021/0152202 A1    May 20, 2021

Related U.S. Application Data

(63) Continuation of application No. PCT/JP2019/022986, filed on Jun. 10, 2019.

(30) Foreign Application Priority Data

Jun. 11, 2018 (JP) .............................. JP2018-111070

(51) Int. Cl.
*H04B 1/04* (2006.01)
*H04B 1/40* (2015.01)
(Continued)

(52) U.S. Cl.
CPC .......... *H04B 1/0475* (2013.01); *H04B 1/006* (2013.01); *H04B 1/04* (2013.01); *H04B 1/10* (2013.01);
(Continued)

(58) Field of Classification Search
CPC .... H01B 1/0053; H01B 1/0057; H01B 1/006; H01B 1/0064; H01B 1/0078; H01B 1/04;
(Continued)

(56) References Cited

U.S. PATENT DOCUMENTS

| | | | |
|---|---|---|---|
| 6,961,544 B1 * | 11/2005 | Hagstrom | H04B 1/28 455/78 |
| 10,271,448 B2 * | 4/2019 | Yuen | H01L 23/49541 |
| 10,276,521 B2 * | 4/2019 | Babcock | H04B 1/40 |
| 10,840,956 B2 * | 11/2020 | Naniwa | H04B 1/38 |
| 10,972,069 B2 * | 4/2021 | Matsumoto | H04B 1/0458 |

(Continued)

FOREIGN PATENT DOCUMENTS

| | | |
|---|---|---|
| JP | 2009-130006 A | 6/2009 |
| JP | 2010-183590 A | 8/2010 |

(Continued)

OTHER PUBLICATIONS

International Search Report and Written Opinion dated Aug. 13, 2019, received for PCT Application No. PCT/JP2019/022986, Filed on Jun. 10, 2019, 15 pages including English Translation.
Written Opinion of the International Searching Authority dated Aug. 13, 2019, received for PCT Application No. PCT/JP2019/022986, 12 pages. (Previously filed; submitting English translation only.).

(Continued)

*Primary Examiner* — Quochien B Vuong
(74) *Attorney, Agent, or Firm* — Xsensus LLP

(57) ABSTRACT

A radio frequency module includes a module board, a transmission power amplifier, a first inductance element mounted on a first principal surface and connected to an output terminal of the transmission power amplifier, a reception low-noise amplifier, and a second inductance element mounted on a first principal surface connected to an input terminal of the reception low-noise amplifier. In a plan view of the module board, a conductive member mounted on the (Continued)

first principal surface is disposed between the first inductance element and the second inductance element.

11 Claims, 9 Drawing Sheets

(51) Int. Cl.
    *H04B 1/10*     (2006.01)
    *H04B 1/00*     (2006.01)
    *H04W 52/24*     (2009.01)
    *H04W 52/52*     (2009.01)
    *H04W 88/06*     (2009.01)

(52) U.S. Cl.
    CPC ............ *H04B 1/40* (2013.01); *H04W 52/243* (2013.01); *H04W 52/52* (2013.01); *H04W 88/06* (2013.01); *H04B 2001/0408* (2013.01); *H04B 2001/0416* (2013.01)

(58) Field of Classification Search
    CPC ...... H01B 1/0458; H01B 1/0475; H01B 1/38; H01B 1/40; H01B 1/44; H01B 1/48; H01B 1/525; H01B 10/40; H01B 2001/0408; H04W 52/52; H04W 52/243; H04W 88/06; H04M 1/02; H04M 1/0274; H04M 1/0277

See application file for complete search history.

(56) References Cited

U.S. PATENT DOCUMENTS

| | | | |
|---|---|---|---|
| 2009/0130999 A1 | 5/2009 | Chen et al. | |
| 2010/0253435 A1 | 10/2010 | Ichitsubo et al. | |
| 2011/0279344 A1* | 11/2011 | He ..................... | H01Q 9/0435 343/852 |

FOREIGN PATENT DOCUMENTS

| | | |
|---|---|---|
| JP | 2014-522216 A | 8/2014 |
| JP | 2015-162875 A | 9/2015 |
| WO | 2017/006866 A1 | 1/2017 |
| WO | 2018/088410 A1 | 5/2018 |

OTHER PUBLICATIONS

Korean Office Action dated Jan. 14, 2022, in corresponding Korean Patent Application No. 10-2020-7035110, 9 pages.

* cited by examiner

RADIO FREQUENCY MODULE AND COMMUNICATION DEVICE

CROSS REFERENCE TO RELATED APPLICATION

This is a continuation application of PCT International Application No. PCT/JP2019/022986 filed on Jun. 10, 2019, designating the United States of America, which is based on and claims priority of Japanese Patent Application No. 2018-111070 filed on Jun. 11, 2018. The entire disclosures of the above-identified applications, including the specifications, drawings and claims are incorporated herein by reference in their entirety.

TECHNICAL FIELD

The present disclosure relates to a radio frequency module and a communication device.

BACKGROUND

In mobile communication apparatuses such as a mobile phone the arrangement configuration of circuit elements included in radio frequency front-end circuits is becoming complex, particularly with developments in multiband technologies.

Patent Literature 1 discloses a circuit configuration of a transceiver (a transmission and reception circuit) that includes multiple transmitters (transmission paths), multiple receivers (reception paths), and a switchplexer disposed between an antenna and the transmitters and receivers, for performing carrier aggregation (CA) across multiple communication bands (frequency bands). Each of the transmitters has transmission circuits, a PA (a transmission power amplifier), and output circuits, while each of the receivers has reception circuits, an LNA (a reception low-noise amplifier), and input circuits. The output circuits include elements such as a transmission filter, an impedance matching circuit, and a duplexer, while the input circuits include elements such as a reception filter, an impedance matching circuit, and a duplexer. This configuration allows CA to be performed with switching operations of the switchplexer.

CITATION LIST

Patent Literature

PTL 1: Japanese Unexamined Patent Application Publication (Translation of PCT Application) No. 2014-522216

SUMMARY

Technical Problems

However, if the transceiver (the transmission and reception circuit) disclosed in patent literature 1 is implemented in a single module as a compact front-end circuit in a mobile communication device, a transmitter and a receiver (a reception path) may be located in close proximity, and accordingly, electromagnetic field coupling may occur between inductance components of the output circuits of the transmitter (a transmission path) and inductance components of the input circuits of the receiver (the reception path). This poses the following problem. Harmonic components of a high-power radio frequency transmission signal amplified by the PA (the transmission power amplifier), or intermodulation distortion components between this radio frequency transmission signal and another radio frequency signal, flow into the receiver (the reception path) via the electromagnetic field coupling, reducing the reception sensitivity of the receiver (the reception path).

The present disclosure is conceived for solving the above problem and has as an object to provide a radio frequency module and a communication device that prevent deterioration of reception sensitivity.

Solutions

In order to achieve the aforementioned object, a radio frequency module according to an aspect of the present disclosure includes: a module board including a first principal surface and a second principal surface on opposite sides of the module board; a first transmission power amplifier configured to amplify a radio frequency transmission signal; a transmission output matching circuit connected to an output terminal of the first transmission power amplifier; a first reception low-noise amplifier configured to amplify a radio frequency reception signal; and a reception input matching circuit connected to an input terminal of the first reception low-noise amplifier, wherein the transmission output matching circuit includes a first inductance element mounted on the first principal surface, the reception input matching circuit includes a second inductance element mounted on the first principal surface, and in a plan view of the module board, a conductive member mounted on the first principal surface is disposed between the first inductance element and the second inductance element.

Advantageous Effects

The present disclosure can provide a radio frequency module and a communication device that prevent deterioration of reception sensitivity.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
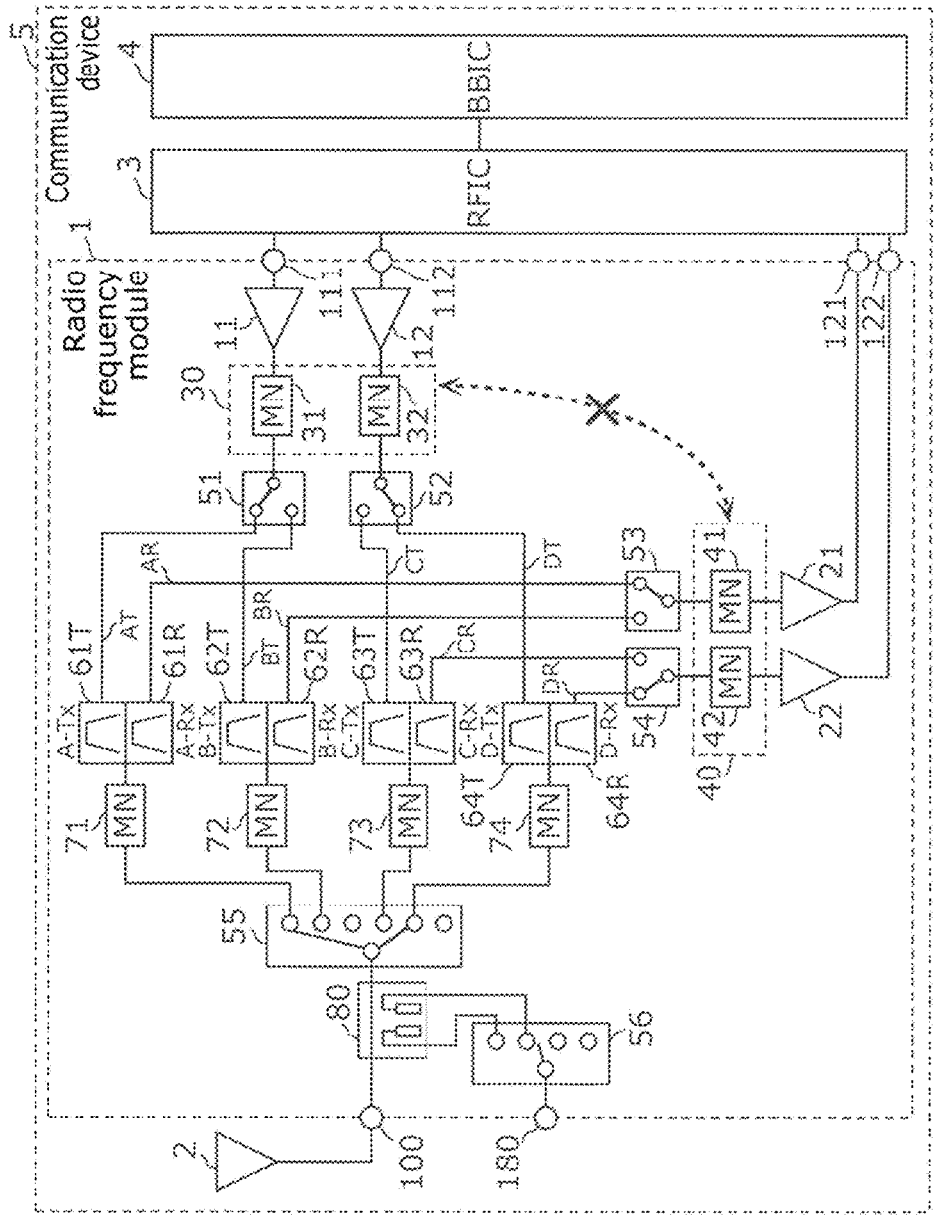
FIG. 1 is a circuit configuration diagram of a radio frequency module according to Embodiment 1.

Hereinafter, an exemplary embodiment and working examples of the present disclosure will be described in detail with reference to the drawings. It should be noted that each of the subsequently described exemplary embodiment and working examples shows a generic or a specific example. The numerical values, shapes, materials, elements, the arrangement and connection of the elements, and others indicated in the following exemplary embodiment and working examples are mere examples, and therefore are not intended to limit the present disclosure. Among the elements described in the following exemplary embodiment and working examples, elements not recited in any one of the independent claims are described as optional elements. In addition, the sizes of the elements and the ratio of the sizes illustrated in the drawings are not necessarily accurate.

It should be noted that, with regard to A, B, and C which are mounted on a board in the subsequent exemplary embodiment, "C is mounted between A and B in a plan view of the board (or a principal surface of the board)" means that, in a plan view of the board, at least part of the region of C projected in a plan view of the board overlaps a line connecting an arbitrary point in a region of A projected in a plan view of the board and an arbitrary point in the region of B projected in a plan view of the board.

Embodiment 1

1.1 Circuit Configuration of Radio Frequency Module 1 and Communication Device 5

FIG. 1 is a circuit configuration diagram of radio frequency module 1 according to Embodiment 1. As illustrated in the figure, communication device 5 includes radio frequency module 1, antenna element 2, RF signal processing circuit (RFIC) 3, and baseband signal processing circuit (BBIC) 4.

RFIC 3 is an RF signal processing circuit that processes a radio frequency signal that is to be transmitted or has been received by antenna element 2. Specifically, RFIC 3 performs, by downconversion, and so on, signal processing on a radio frequency reception signal input via a reception signal path of radio frequency module 1, and outputs the reception signal generated by the signal processing to BBIC 4. Furthermore, RFIC 3 performs, by upconversion, and so on, signal processing on a transmission signal input from BBIC 4, and outputs a radio frequency transmission signal generated by the signal processing to a transmission signal path of radio frequency module 1.

BBIC 4 is a circuit that performs signal processing using an intermediate frequency band having a lower frequency than a radio frequency signal propagated in radio frequency module 1. The signal processed by BBIC 4 is, for example, used as an image signal for image display or as a sound signal for communication via a speaker.

Furthermore, RFIC 3 also functions as a controller that controls the connection of switches 51, 52, 53, 54, 55, and 56 included in radio frequency module 1, based on the communication band (frequency band) to be used. Specifically, RFIC 3 switches the connections of switches 51 to 56 included in radio frequency module 1 according to a control signal (not illustrated). It should be noted that the controller may be provided outside RFIC 3, and may be provided in radio frequency module 1 or BBIC 4, for example.

Antenna element 2 is connected to common terminal 100 of radio frequency module 1, emits radio frequency signals output from radio frequency module 1, and receives radio frequency signals from the outside and outputs the received radio frequency signals to radio frequency module 1.

It should be noted that in communication device 5 according to this embodiment, antenna element 2 and BBIC 4 are not essential elements.

Next, the detailed configuration of radio frequency module 1 will be described.

As illustrated in FIG. 1, radio frequency module 1 includes common terminal 100, transmission power amplifiers 11 and 12, reception low-noise amplifiers 21 and 22, transmission filters 61T, 62T, 63T, and 64T, reception filters 61R, 62R, 63R, and 64R, transmission output matching circuit 30, reception input matching circuit 40, matching circuits 71, 72, 73, and 74, switches 51, 52, 53, 54, 55, and 56, coupler 80, coupler output terminal 180.

Common terminal 100 is connected to antenna element 2.

Transmission power amplifier 11 is a first transmission power amplifier that amplifies radio frequency signals of communication band A (a first communication band) and communication band B, both belonging to a first frequency band group. Transmission power amplifier 12 is a second transmission power amplifier that amplifies radio frequency signals of communication band C (a second communication band) and communication band D, both belonging to a second frequency band group covering frequencies higher than those of the first frequency band group.

Reception low-noise amplifier 21 is a first reception low-noise amplifier that amplifies, with low noise, radio frequency signals of communication band A and communication band B. Reception low-noise amplifier 22 is a second reception low-noise amplifier that amplifies, with low noise, radio frequency signals of communication band C and communication band D.

Transmission filter 61T is disposed in transmission path AT connecting transmission power amplifier 11 and common terminal 100, and passes radio frequency transmission signals of the transmission band of communication band A out of radio frequency transmission signals amplified by transmission power amplifier 11. Transmission filter 62T is disposed in transmission path BT connecting transmission power amplifier 11 and common terminal 100, and passes radio frequency transmission signals of the transmission band of communication band B out of radio frequency transmission signals amplified by transmission power amplifier 11. Transmission filter 63T is disposed in transmission path CT connecting transmission power amplifier 12 and common terminal 100, and passes radio frequency transmission signals of the transmission band of communication band C out of radio frequency transmission signals amplified by transmission power amplifier 12. Transmission filter 64T is disposed in transmission path DT connecting transmission power amplifier 12 and common terminal 100, and passes radio frequency transmission signals of the transmission band of communication band D out of radio frequency transmission signals amplified by transmission power amplifier 12.

Reception filter 61R is disposed in reception path AR connecting reception low-noise amplifier 21 and common terminal 100, and passes radio frequency reception signals of the reception band of communication band A out of radio frequency reception signals input from common terminal 100. Reception filter 62R is disposed in reception path BR connecting reception low-noise amplifier 21 and common terminal 100, and passes radio frequency reception signals of the reception band of communication band B out of radio frequency reception signals input from common terminal 100. Reception filter 63R is disposed in reception path CR connecting reception low-noise amplifier 22 and common terminal 100, and passes radio frequency reception signals of the reception band of communication band C out of radio frequency reception signals input from common terminal 100. Reception filter 64R is disposed in reception path DR connecting reception low-noise amplifier 22 and common terminal 100, and passes radio frequency reception signals of the reception band of communication band D out of radio frequency reception signals input from common terminal 100.

It should be noted that above transmission filters 61T to 64T and reception filters 61R to 64R may be, but are not limited to, any of surface acoustic wave filters, acoustic wave filters that make use of bulk acoustic waves (BAWs), LC resonant filters, and dielectric filters, for example.

Transmission filter 61T and reception filter 61R constitute duplexer 61 which has, as a passband, communication band A. Furthermore, transmission filter 62T and reception filter 62R constitute duplexer 62 which has, as a passband, communication band B. In addition, transmission filter 63T and reception filter 63R constitute duplexer 63 which has, as a passband, communication band C. Moreover, transmission filter 64T and reception filter 64R constitute duplexer 64 which has, as a passband, communication band D.

Transmission output matching circuit 30 includes matching circuits 31 and 32. Matching circuit 31 is disposed in a transmission path connecting transmission power amplifier 11 and transmission filters 61T and 62T, and matches the impedance of transmission power amplifier 11 and the impedance of transmission filters 61T and 62T. Matching circuit 32 is disposed in a transmission path connecting transmission power amplifier 12 and transmission filters 63T and 64T, and matches the impedance of transmission power amplifier 12 and the impedance of transmission filters 63T and 64T.

Reception input matching circuit 40 includes matching circuits 41 and 42. Matching circuit 41 is disposed in a reception path connecting reception low-noise amplifier 21 and reception filters 61R and 62R, and matches the impedance of reception low-noise amplifier 21 and the impedance of reception filters 61R and 62R. Matching circuit 42 is disposed in a reception path connecting reception low-noise amplifier 22 and reception filters 63R and 64R, and matches the impedance of reception low-noise amplifier 22 and the impedance of reception filters 63R and 64R.

Switch 51 is a second switch disposed in a transmission path connecting matching circuit 31 and transmission filters 61T and 62T, and switches between connecting transmission power amplifier 11 and transmission filter 61T and connecting transmission power amplifier 11 and transmission filter 62T. For example, switch 51 is implemented as a single pole double throw (SPDT) switch circuit in which the common terminal is connected to matching circuit 31 while one selection terminal is connected to transmission filter 61T and the other selection terminal is connected to transmission filter 62T. Switch 52 is a second switch disposed in a transmission path connecting matching circuit 32 and transmission filters 63T and 64T, and switches between connecting transmission power amplifier 12 and transmission filter 63T and connecting transmission power amplifier 12 and transmission filter 64T. For example, switch 52 is implemented as an SPDT switch circuit in which the common terminal is connected to matching circuit 32 while one selection terminal is connected to transmission filter 63T and the other selection terminal is connected to transmission filter 64T. Switch 53 is a third switch disposed in a reception path connecting matching circuit 41 and reception filters 61R and 62R, and switches between connecting reception low-noise amplifier 21 and reception filter 61R and connecting reception low-noise amplifier 21 and reception filter 62R. For example, switch 53 is implemented as an SPDT switch circuit in which the common terminal is connected to matching circuit 41 while one selection terminal is connected to reception filter 61R and the other selection terminal is connected to reception filter 62R. Switch 54 is a third switch disposed in a reception path connecting matching circuit 42 and reception filters 63R and 64R, and switches between connecting reception low-noise amplifier 22 and reception filter 63R and connecting reception low-noise amplifier 22 and reception filter 64R. For example, switch 54 is implemented as an SPDT switch circuit in which the common terminal is connected to matching circuit 42 while one selection terminal is connected to reception filter 63R and the other selection terminal is connected to reception filter 64R.

Switch 55 is a first switch disposed in a signal path connecting common terminal 100 with transmission filters 61T to 64T and reception filters 61R to 64R. Switch 55 switches among (1) connecting common terminal 100 with transmission filter 61T and reception filter 61R, (2) connecting common terminal 100 with transmission filter 62T and reception filter 62R, (3) connecting common terminal 100 with transmission filter 63T and reception filter 63R, and (4) connecting common terminal 100 with transmission filter 64T and reception filter 64R. Switch 55 is implemented as a multi-connection switch circuit capable of simultaneously establishing two or more of the above connections (1) to (4).

Matching circuit 71 is disposed in a path connecting switch 55 with transmission filter 61T and reception filter 61R, and matches the impedance of antenna element 2 and switch 55 and the impedance of transmission filter 61T and reception filter 61R. Matching circuit 72 is disposed in a path connecting switch 55 with transmission filter 62T and reception filter 62R, and matches the impedance of antenna element 2 and switch 55 and the impedance of transmission filter 62T and reception filter 62R. Matching circuit 73 is disposed in a path connecting switch 55 with transmission filter 63T and reception filter 63R, and matches the impedance of antenna element 2 and switch 55 and the impedance of transmission filter 63T and reception filter 63R. Matching circuit 74 is disposed in a path connecting switch 55 with transmission filter 64T and reception filter 64R, and matches the impedance of antenna element 2 and switch 55 and the impedance of transmission filter 64T and reception filter 64R.

Coupler 80 and switch 56 form a circuit that monitors the power intensity of radio frequency signals transferred between common terminal 100 and switch 55, and output the monitored power intensity to, e.g., RFIC 3 via coupler output terminal 180.

It should be noted that matching circuits 71 to 74, coupler 80, switch 56, and coupler output terminal 180 are not essential elements of the radio frequency module according to the present disclosure.

In the configuration of radio frequency module 1 described above, transmission power amplifier 11, matching circuit 31, switch 51, and transmission filters 61T and 62T form a first transmission circuit that outputs radio frequency transmission signals of communication band A and communication band B toward common terminal 100. Transmission power amplifier 12, matching circuit 32, switch 52, and transmission filters 63T and 64T form a second transmission circuit that outputs radio frequency transmission signals of communication band C and communication band D toward common terminal 100. The first transmission circuit and the second transmission circuit form a transmission circuit that outputs radio frequency transmission signals of communication bands A to D toward common terminal 100.

Reception low-noise amplifier 21, matching circuit 41, switch 53, and reception filters 61R and 62R form a first reception circuit that receives input of radio frequency reception signals of communication band A and communication band B from antenna element 2 via common terminal 100. Reception low-noise amplifier 22, matching circuit 42, switch 54, and reception filters 63R and 64R form a second reception circuit that receives input of radio frequency reception signals of communication band C and communication band D from antenna element 2 via common terminal 100. The first reception circuit and the second reception circuit form a reception circuit that receives input of radio frequency reception signals of communication bands A to D from common terminal 100.

The above-described circuit configuration enables radio frequency module 1 according to this embodiment to perform at least one of simultaneously transmitting, simultaneously receiving, and simultaneously transmitting and receiving a radio frequency signal of either communication band A or communication band B and a radio frequency signal of either communication band C or communication band D.

It should be noted that, in the radio frequency module according to the present disclosure, the transmission circuit and the reception circuit need not be connected to common terminal 100 via switch 55; and the transmission circuit and the reception circuit may be connected to antenna element 2 via a different terminal. It should also be noted that the circuit configuration of the radio frequency module according to the present disclosure may include at least transmission power amplifier 11, matching circuit 31, reception low-noise amplifier 21, and matching circuit 41, and need not include switches 51 to 56, transmission filters 61T to 64T, and reception filters 61R to 64R. In this case, the system transmits and receives radio frequency signals of a single communication band but does not simultaneously transmit, simultaneously receive, or simultaneously transmit and receive radio frequency signals of two or more communication bands.

Here, if the circuit elements of above-described radio frequency module 1 are implemented in a single module as a compact front-end circuit, electromagnetic field coupling may occur between, for example, inductance components of transmission output matching circuit 30 and inductance components of reception input matching circuit 40. Then, if harmonic components of a high-power radio frequency transmission signal amplified by transmission power amplifier 11 or 12, or intermodulation distortion components between this radio frequency transmission signal and another radio frequency signal, flow into the reception circuit via the electromagnetic field coupling, the reception sensitivity of the reception circuit deteriorates. As an example, the frequency of a harmonic of a radio frequency transmission signal amplified by transmission power amplifier 11 may overlap at least part of the reception band of communication band C. As another example, the frequency of intermodulation distortion between a radio frequency transmission signal amplified by transmission power amplifier 11 and another radio frequency signal may overlap at least part of the reception bands of communication bands A to D.

To address this, radio frequency module 1 according to this embodiment has a configuration that prevents electromagnetic field coupling between inductance components of transmission output matching circuit 30 and inductance components of reception input matching circuit 40. The following will describe the configuration that prevents such electromagnetic field coupling in radio frequency module 1 according to this embodiment.

1.2 Circuit Element Arrangement Configuration of Radio Frequency Module 1

Figure 2A:
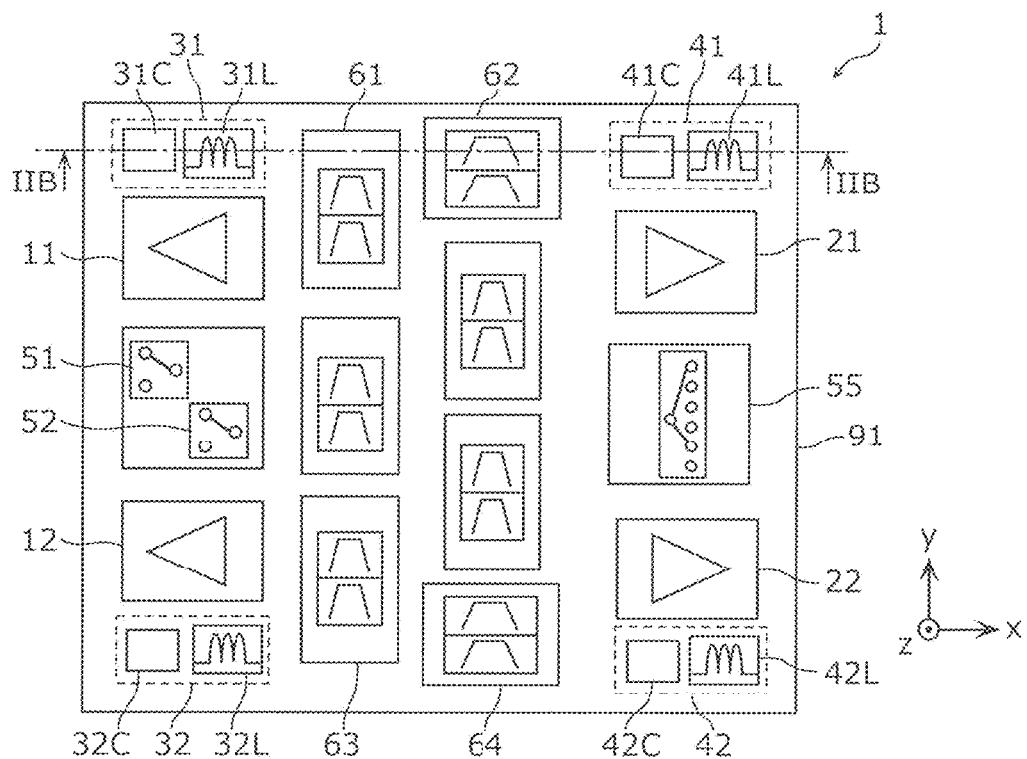
FIG. 2A is a schematic diagram illustrating a plan view configuration of the radio frequency module according to Embodiment 1.
Figure 2B:
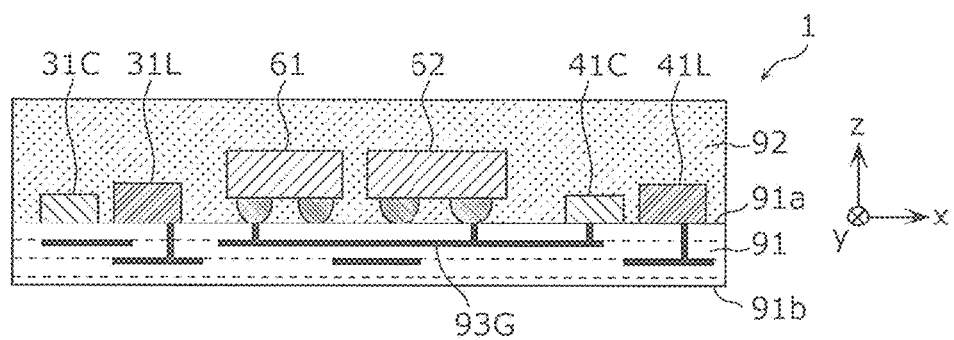
FIG. 2B is a schematic diagram illustrating a cross-sectional configuration of the radio frequency module according to Embodiment 1.

FIG. 2A is a schematic diagram illustrating a plan view configuration of radio frequency module 1 according to Embodiment 1. FIG. 2B is a schematic diagram illustrating a cross-sectional configuration of radio frequency module 1 according to Embodiment 1, and is specifically a cross-sectional view along line IIB-IIB in FIG. 2A.

As illustrated in FIGS. 2A and 2B, radio frequency module 1 according to this embodiment further includes module board 91 and resin member 92, in addition to the circuit configuration illustrated in FIG. 1.

Module board 91, having principal surface 91a (a first principal surface) and principal surface 91b (a second principal surface) on the opposite sides, is a board on which the transmission circuit and the reception circuit are mounted. Module board 91 may be, for example, a low-temperature co-fired ceramics (LTCC) board having a stacked structure of dielectric layers, or a printed circuit board.

Resin member 92 is disposed on principal surface 91a of module board 91 to cover the transmission circuit, the reception circuit, and principal surface 91a of module board 91. Resin member 92 has a function of ensuring the reliability, such as the mechanical strength and the moisture resistance, of the circuit elements of the transmission circuit and the reception circuit. It should be noted that resin member 92 is not an essential element of the radio frequency module according to the present disclosure.

As illustrated in FIGS. 2A and 2B, in radio frequency module 1 according to this embodiment, transmission power amplifiers 11 and 12, reception low-noise amplifiers 21 and 22, duplexers 61 to 64, matching circuits 31, 32, 41, and 42, and switches 51, 52, and 55 are surface-mounted on principal surface 91a of module board 91. It should be noted that, although not illustrated in FIGS. 2A and 2B, switches 53, 54, and 56, matching circuits 71 to 74, and coupler 80 may be surface-mounted on either principal surface 91a or 91b of module board 91 or may be embedded in module board 91.

Matching circuits 31, 32, 41, and 42 are mounted on principal surface 91a of module board 91. Matching circuit 31 includes inductor 31L and capacitor 31C. Matching circuit 32 includes inductor 32L and capacitor 32C. Matching circuit 41 includes inductor 41L and capacitor 41C. Matching circuit 42 includes inductor 42L and capacitor 42C. Inductors 31L and 32L are each a first inductance element in transmission output matching circuit 30 and implemented, for example, as a chip inductor or as a wiring pattern formed on principal surface 91a. Inductors 41L and 42L are each a second inductance element in reception input matching circuit 40 and implemented, for example, as a chip inductor or as a wiring pattern formed on principal surface 91a.

Here, in radio frequency module 1 according to this embodiment, in a plan view of module board 91 (viewed from the z-axis direction), conductive members mounted on principal surface 91a are disposed between (i) inductors 31L and 32L and (ii) inductors 41L and 42L. Each conductive member here is an electronic member having a conductive member such as a signal extraction electrode. For example, the conductive member may be at least any of passive elements such as a resistor element, a capacitive element, an inductive element, a filter, a switch, a signal wire, and a signal terminal, and active elements such as an amplifier and a control circuit. In this embodiment, the conductive member is at least any of duplexers 61 to 64. Further, the conductive member may be at least any of the transmission filters and the reception filters in duplexers 61 to 64. The transmission filters and the reception filters in duplexers 61 to 64 each have conductive members such as signal extraction electrodes. For example, at least one of the signal extraction electrodes is connected to ground pattern 93G disposed in module board 91.

According to the above configuration, while transmission output matching circuit 30 and reception input matching circuit 40 are disposed on principal surface 91a of module board 91, at least one of duplexers 61 to 64 mounted on principal surface 91a is disposed between (i) inductors 31L and 32L and (ii) inductors 41L and 42L. At least one of duplexers 61 to 64 can thus block electromagnetic fields generated by inductors 31L and 32L and inductors 41L and 42L to prevent electromagnetic field coupling between (i) inductors 31L and 32L and (ii) inductors 41L and 42L. This can reduce harmonic components of a high-power radio frequency transmission signal amplified by transmission power amplifiers 11 and 12, or intermodulation distortion components between this radio frequency transmission signal and another radio frequency signal, flowing into the reception circuit. Deterioration of the reception sensitivity of radio frequency module 1 can therefore be prevented.

It should be noted that "a conductive member mounted on principal surface 91a is disposed between (i) inductors 31L and 32L and (ii) inductors 41L and 42L in a plan view of module board 91" holds for at least any one of the cases: (1) at least part of the region of the conductive member projected on the plan view overlaps a line connecting any point in the region of inductor 31L projected on the plan view and any point in the region of inductor 41L projected on the plan view, (2) at least part of the region of the conductive member projected on the plan view overlaps a line connecting any point in the region of inductor 32L projected on the plan view and any point in the region of inductor 41L projected on the plan view, (3) at least part of the region of the conductive member projected on the plan view overlaps a line connecting any point in the region of inductor 31L projected on the plan view and any point in the region of inductor 42L projected on the plan view, and (4) at least part of the region of the conductive member projected on the plan view overlaps a line connecting any point in the region of inductor 32L projected on the plan view and any point in the region of inductor 42L projected on the plan view.

That is, although radio frequency module 1 according to this embodiment has a configuration in which conductive members mounted on principal surface 91a are disposed between (i) inductors 31L and 32L and (ii) inductors 41L and 42L, the conductive members mounted on principal surface 91a may be disposed between at least one of inductors 31L and 32L and at least one of inductors 41L and 42L. This can reduce harmonic components of a high-power radio frequency transmission signal transferred through a transmission path, or intermodulation distortion components between this radio frequency transmission signal and another radio frequency signal, flowing into a reception path. Deterioration of the reception sensitivity in the reception path can therefore be prevented. Consequently, deterioration of the reception sensitivity of radio frequency module 1 can be prevented.

Figure 3A:
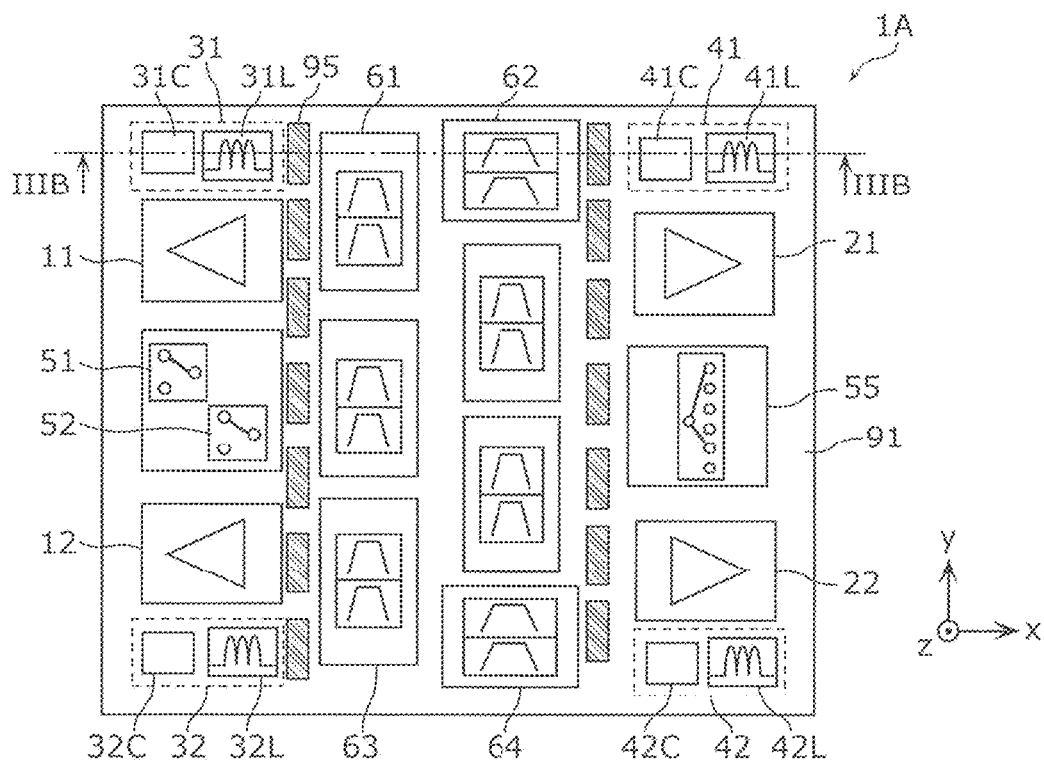
FIG. 3A is a schematic diagram illustrating a plan view configuration of a radio frequency module according to a variation of Embodiment 1.
Figure 3B:
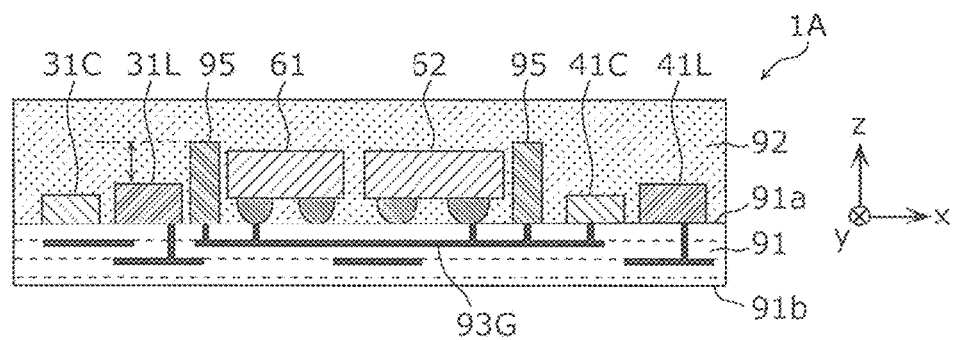
FIG. 3B is a schematic diagram illustrating a cross-sectional configuration of the radio frequency module according to the variation of Embodiment 1.

1.3 Circuit Element Arrangement Configuration of Radio Frequency Module 1A According to Variation FIG. 3A is a schematic diagram illustrating a plan view configuration of radio frequency module 1A according to a variation of Embodiment 1. FIG. 3B is a schematic diagram illustrating a cross-sectional configuration of radio frequency module 1A according to the variation of Embodiment 1, and is specifically a cross-sectional view along line IIIB-IIIB in FIG. 3A.

Radio frequency module 1A according to this variation is different from radio frequency module 1 according to Embodiment 1 only in that metal chips 95 are additionally disposed. Hereinafter, radio frequency module 1A according to this variation will be described mainly for points that are different from radio frequency module 1 according to Embodiment 1, while points that are the same will not be described.

In radio frequency module 1A according to this variation, in a plan view of module board 91 (viewed from the z-axis direction), metal chips 95 mounted on principal surface 91a are disposed between (i) inductors 31L and 32L and (ii) inductors 41L and 42L. That is, in this variation, metal chips 95 are disposed as conductive members disposed between (i) inductors 31L and 32L and (ii) inductors 41L and 42L. As illustrated in FIG. 3B, each of the metal chips is connected to ground pattern 93G disposed in module board 91.

Metal chips 95 are desirably higher than inductors 31L and 41L in the z-axis direction.

According to the above configuration, metal chips 95 can block electromagnetic fields generated by inductors 31L and 321_ and inductors 41L and 42L to prevent electromagnetic field coupling between (i) inductors 31L and 32L and (ii) inductors 41L and 42L. This can reduce harmonic components of a high-power radio frequency transmission signal amplified by transmission power amplifiers 11 and 12, or intermodulation distortion components between this radio frequency transmission signal and another radio frequency signal, flowing into the reception circuit. Deterioration of the reception sensitivity of radio frequency module 1A can therefore be prevented.

It should be noted that, although duplexers 61 to 64 are disposed between (i) inductors 31L and 32L and (ii) inductors 41L and 42L in addition to metal chips 95 mounted on principal surface 91a in this variation, duplexers 61 to 64 need not be disposed between (i) inductors 31L and 32L and (ii) inductors 41L and 42L in this variation. This is because metal chips 95 have the function of blocking electromagnetic fields generated by inductors 31L, 32L, 41L, and 42L.

This embodiment and its variation have illustrated the transmission filters, the reception filters, and the metal chips as conductive members disposed between (i) inductors 31L and 32L and (ii) inductors 41L and 42L. In addition to or instead of the transmission filters, the reception filters, and the metal chips, the conductive members may also be any of (1) switch 55, (2) switch 51 or 52, (3) switch 53 or 54, (4) a diplexer (a multiplexer) disposed between (i) common terminal 100 and (ii) the transmission filters and the reception filters, (5) a chip capacitor, and (6) a control circuit that generates at least one of a control signal for adjusting the gains of transmission power amplifiers 11 and 12 and reception low-noise amplifiers 21 and 22 and a control signal for controlling the switching of switches 51 to 56.

The control circuit in above (6) may be a switch IC that includes at least one of switches 51 to 56.

The circuit elements in above (1) to (6) desirably have an electrode set to a ground potential or a fixed potential. For example, the circuit elements in above (1) to (6) are desirably connected to a ground pattern formed in module board 91. This improves the electromagnetic field blocking function of the circuit elements in above (1) to (6).

With the conductive members illustrated above, electromagnetic fields generated by inductors 31L and 32L and inductors 41L and 42L can be blocked to prevent electromagnetic field coupling between (i) inductors 31L and 32L and (ii) inductors 41L and 42L. This can reduce harmonic components of a high-power radio frequency transmission signal amplified by transmission power amplifiers 11 and 12, or intermodulation distortion components between this radio frequency transmission signal and another radio frequency signal, flowing into the reception circuit. Deterioration of the reception sensitivity of the radio frequency module can therefore be prevented.

Magnetic fluxes generated by inductors 31L and 32L may be orthogonal to magnetic fluxes generated by inductors 41L and 42L. Specifically, for example, the winding axes of coils that constitute inductors 31L and 32L may be orthogonal to the winding axes of coils that constitute inductors 411_ and 42L. This can prevent interaction between (i) magnetic fields defined by inductors 31L and 32L and (ii) magnetic fields defined by inductors 41L and 42L. Consequently, electromagnetic field coupling between (i) inductors 31L and 321_ and (ii) inductors 41L and 42L can be prevented to further prevent a reduction in the reception sensitivity of the radio frequency module.

1.4 Spaced-Apart Arrangement of First Inductance Element and Second Inductance Element In radio frequency module 1 according to this embodiment, the conductive members mounted on module board 91 are disposed between (i) inductors 31L and 32L and (H) inductors 41L and 42L. Alternatively, radio frequency module 1 according to this embodiment may have a configuration as follows.

Figure 4:
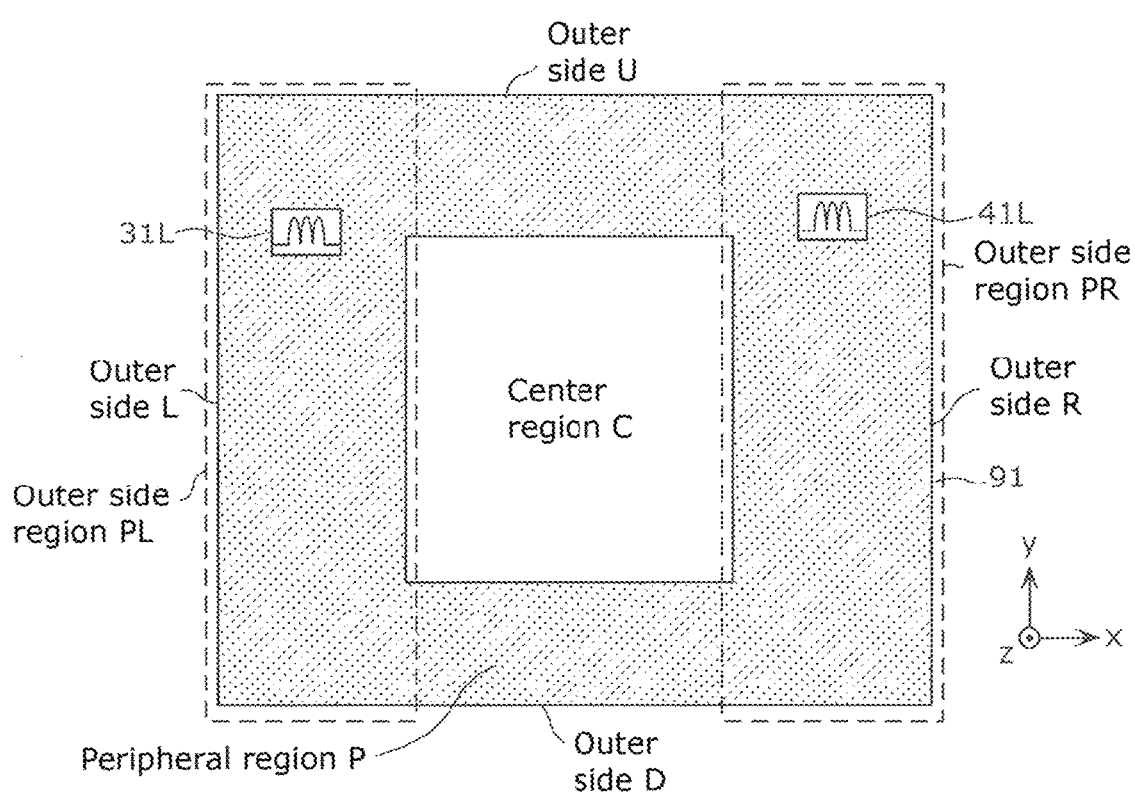
FIG. 4 is a diagram for describing a spaced arrangement of a first inductance element and a third inductance element according to Embodiment 1.

FIG. 4 is a diagram for describing a spaced-apart arrangement of inductors 31L and 41L according to Embodiment 1. This figure shows only inductor 31L of matching circuit 31 and inductor 41L of matching circuit 41, among transmission power amplifiers 11 and 12, reception low-noise amplifiers 21 and 22, duplexers 61 to 64, matching circuits 31, 32, 41, and 42, and switches 51, 52, and 55 mounted on principal surface 91a of module board 91.

In a plan view of principal surface 91a, principal surface 91a is rectangular and has central region C that includes at least one of transmission filters 61T to 64T and reception filters 61R to 64R, and peripheral region P that excludes central region C. Peripheral region P further has four outer side regions PU (not illustrated in FIG. 4), PD (not illustrated in FIG. 4), PL, and PR that include four outer sides U, D, L, and R, respectively, of principal surface 91a. Here, in a plan view of principal surface 91a, at least one of inductors 31L and 32L and at least one of inductors 41L and 42L are disposed in two outer side regions PL and PR, respectively, located on opposite sides of central region C, or in two outer side regions PU and PD, respectively, located on opposite sides of central region C.

According to the above configuration, inductors 31L and 32L and inductors 41L and 42L are distributed on principal surface 91a of module board 91 in outer side regions located on opposite sides of central region C that includes at least any one of the transmission filters and the reception filters. Inductors 31L and 32L and inductors 41L and 42L disposed on principal surface 91a of module board 91 are thus spaced apart from each other, so that it is possible to reduce the extent to which electromagnetic fields generated by inductors 31L and 32L reach inductors 41L and 42L. This can reduce harmonic components of a high-power radio frequency transmission signal amplified by transmission power amplifiers 11 and 12, or intermodulation distortion components between this radio frequency transmission signal and another radio frequency signal, flowing into the reception circuit. Deterioration of the reception sensitivity of radio frequency module 1 can therefore be prevented.

1.5 Summary of Embodiment 1

As above, radio frequency module 1 according to this embodiment includes: module board 91 that includes principal surface 91a and principal surface 91b on opposite sides of module board 91; transmission power amplifier 11 that amplifies a radio frequency transmission signal; transmission output matching circuit 30 connected to an output terminal of transmission power amplifier 11; reception low-noise amplifier 21 that amplifies a radio frequency reception signal; and reception input matching circuit 40 connected to an input terminal of reception low-noise amplifier 21. Transmission output matching circuit 30 includes inductor 311 mounted on principal surface 91a, and reception input matching circuit 40 includes inductor 41L mounted on principal surface 91a. Here, in a plan view of module board 91 (viewed from the z-axis direction), a conductive member mounted on principal surface 91a is disposed between inductor 31L and inductor 41L.

Consequently, for example, the conductive member can block electromagnetic fields generated by inductors 31L and 41L even if the frequency of intermodulation distortion between a radio frequency transmission signal of communication band A amplified by transmission power amplifier 11 and another radio frequency signal overlaps part of the reception band of communication band A. This can prevent electromagnetic field coupling between inductor 31L and inductor 41L, thereby preventing the intermodulation distortion from bypassing transmission filter 61T and flowing into the reception path for communication band A. Deterioration of the reception sensitivity of radio frequency module 1 can therefore be prevented.

Radio frequency module 1 according to this embodiment includes: common terminal 100; a first transmission circuit and a second reception circuit that transmit and receive, to and from common terminal 100, radio frequency signals of communication band A belonging to a first frequency band group; a second transmission circuit and a first reception circuit that transmit and receive, to and from common terminal 100, radio frequency signals of communication band C belonging to a second frequency band group covering frequencies higher than frequencies of the first frequency band group; and module board 91 on which the first and second transmission circuits and the first and second reception circuits are mounted. The first transmission circuit includes: transmission power amplifier 11 (a first transmission power amplifier); transmission filter 61T (a first transmission filter) that is disposed in transmission path AT connecting transmission power amplifier 11 and common terminal 100 and has, as a passband, the transmission band of communication band A; and transmission output matching circuit 30 that is mounted on principal surface 91a, is disposed in transmission path AT between transmission power amplifier 11 and transmission filter 61T, and matches the impedances of transmission power amplifier 11 and transmission filter 61T. The second reception circuit includes: reception low-noise amplifier 21 (a second reception low-noise amplifier); and reception filter 61R (a second reception filter) that is disposed in transmission path AR connecting reception low-noise amplifier 21 and common terminal 100 and has, as a passband, the reception band of communication band A. The second transmission circuit includes: transmission power amplifier 12; and transmission filter 63T (a second transmission filter) that is disposed in transmission path CT connecting transmission power amplifier 12 and common terminal 100 and has, as a passband, the transmission band of communication band C. The first reception circuit includes: reception low-noise amplifier 22 (a first reception low-noise amplifier); reception filter 63R (a first reception filter) that is disposed in reception path CR connecting reception low-noise amplifier 22 and common terminal 100 and has, as a passband, the reception band of communication band C; and reception input matching circuit 40 that is mounted on principal surface 91a, is disposed in reception path CR between reception low-noise amplifier 21 and reception filter 63R, and matches the impedances of reception low-noise amplifier 21 and reception filter 63R. Transmission output matching circuit 30 includes inductor 31L, and the reception input matching circuit includes inductor 42L. Here, in a plan view of module board 91, a conductive member mounted on principal surface 91a may be disposed between inductor 31L and inductor 42L.

Consequently, for example, the conductive member can block electromagnetic fields generated by inductors 31L and 42L even if the frequency of a harmonic of a radio frequency transmission signal of communication band A amplified by transmission power amplifier 11, or the frequency of intermodulation distortion between this radio frequency transmission signal and another radio frequency signal, overlaps part of the reception band of communication band C. This can prevent electromagnetic field coupling between inductor 31L and inductor 42L, thereby preventing the intermodulation distortion components from bypassing transmission filter 61T and flowing into the reception path for communication band C. Deterioration of the reception sensitivity of radio frequency module 1 can therefore be prevented.

Radio frequency module 1 according to this embodiment includes common terminal 100, a first transmission circuit, a first reception circuit, and module board 91. The first transmission circuit includes: transmission power amplifier 11 (a first transmission power amplifier); transmission filter 611 (a first transmission filter) that is disposed in a transmission path connecting transmission power amplifier 11 and common terminal 100 and passes radio frequency transmission signals of the transmission band of communication band A; and transmission output matching circuit 30 that is mounted on principal surface 91a, is disposed in a transmission path between transmission power amplifier 11 and transmission filter 61T, and matches the impedances of transmission power amplifier 11 and transmission filter 61T. The first reception circuit includes: reception low-noise amplifier 21 (a first reception low-noise amplifier); reception filter 61R (a first reception filter) that is disposed in a reception path connecting reception low-noise amplifier 21 and common terminal 100 and passes radio frequency reception signals of the reception band of communication band A; and reception input matching circuit 40 that is mounted on principal surface 91a, is disposed in a reception path between reception low-noise amplifier 21 and reception filter 61R, and matches the impedances of reception low-noise amplifier 21 and reception filter 61R. Transmission output matching circuit 30 includes inductor 31L, and the reception input matching circuit includes inductor 41L. Here, in a plan view of principal surface 91a, principal surface 91a includes: central region C including at least one of the transmission filter and the reception filter; and four outer side regions PU, PD, PL, and PR excluding central region C and including respective four outer sides of rectangular principal surface 91a. In a plan view of principal surface 91a, inductor 31L and inductor 41L may each be disposed in a different one of two outer side regions located on opposite sides of central region C.

Inductor 31L and inductor 41L disposed on principal surface 91a of module board 91 are thus spaced apart from each other, so that it is possible to reduce the extent to which an electromagnetic field generated by inductor 31L reaches inductor 41L. This can reduce harmonic components of a high-power radio frequency transmission signal amplified by transmission power amplifier 11, or intermodulation distortion components between this radio frequency transmission signal and another radio frequency signal, flowing into the reception circuit. Deterioration of the reception sensitivity of radio frequency module 1 can therefore be prevented.

Embodiment 2

Embodiment 1 has illustrated what is called a single-sided mounting configuration, in which the circuit elements of the radio frequency module are mounted on principal surface 91a of module board 91. An embodiment below illustrates what is called a double-sided mounting configuration, in which the circuit elements of the radio frequency module are mounted on principal surfaces 91a and 91b of module board 91. It should be noted that the circuit configuration of radio frequency module 1B according to this embodiment is the same as that of radio frequency module 1 according to Embodiment 1 illustrated in FIG. 1 and therefore will not be described.

2.1 Circuit Element Arrangement Configuration of Radio Frequency Module 1B

Figure 5A:
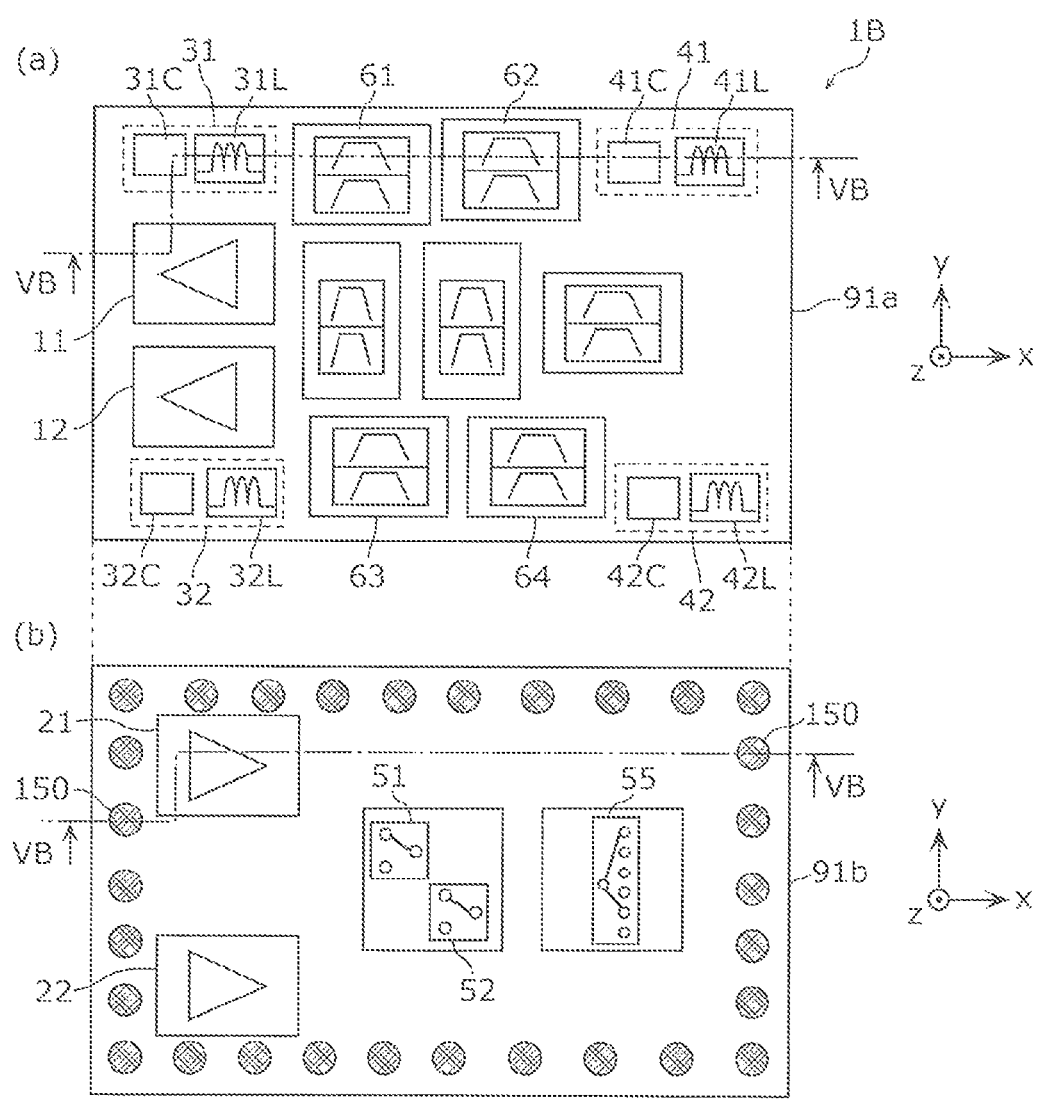
FIG. 5A is a schematic diagram illustrating a plan view configuration of a radio frequency module according to Embodiment 2.
Figure 5B:
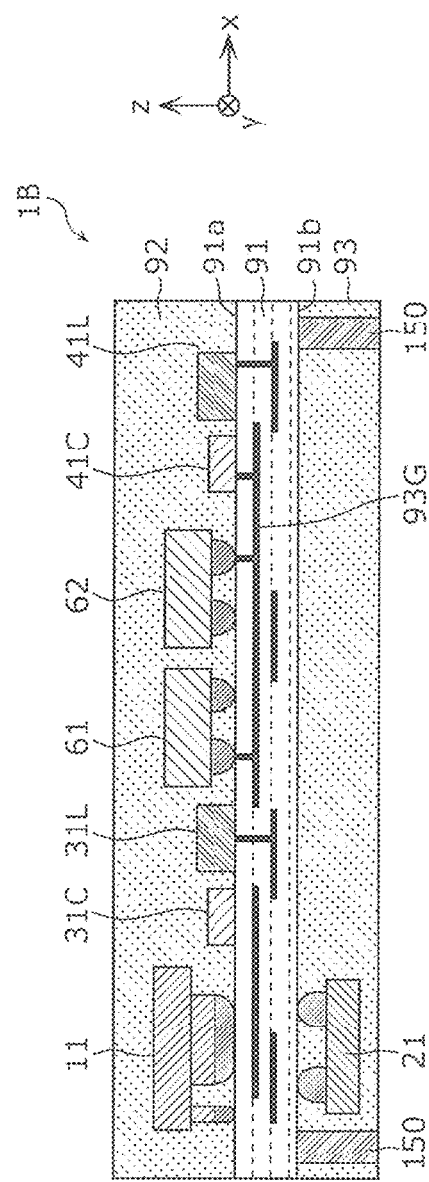
FIG. 5B is a schematic diagram illustrating a cross-sectional configuration of the radio frequency module according to Embodiment 2.

FIG. 5A is a schematic diagram illustrating a plan view configuration of radio frequency module 18 according to Embodiment 2. FIG. 5B is a schematic diagram illustrating a cross-sectional configuration of radio frequency module 16 according to Embodiment 2, and is specifically a cross-sectional view along line VB-VB in FIG. 5A. It should be noted that (a) in FIG. 5A illustrates a view of the arrangement of circuit elements on principal surface 91a of principal surfaces 91a and 91b on the opposite sides of module board 91, viewed from the y-axis positive direction-side. By contrast, (b) in FIG. 5A illustrates a see-through view of the arrangement of circuit elements on principal surface 91*b* viewed from the y-axis positive direction-side.

As illustrated in FIGS. 5A and 5B, radio frequency module 1B according to this embodiment further includes module board 91 and resin members 92 and 93, in addition to the circuit configuration illustrated in FIG. 1. Radio frequency module 16 according to this embodiment is different from radio frequency module 1 according to Embodiment 1 in that the circuit elements of radio frequency module 1B are mounted on both sides of module board 91. Hereinafter, radio frequency module 1B according to this embodiment will be described mainly for points that are different from radio frequency module 1 according to Embodiment 1, while points that are the same will not be described.

As illustrated in FIGS. 5A and 58, in radio frequency module 13 according to this embodiment, transmission power amplifiers 11 and 12, duplexers 61 to 64, and matching circuits 31, 32, 41, and 42 are surface-mounted on principal surface 91*a* of module board 91. On the other hand, reception low-noise amplifiers 21 and 22 and switches 51, 52, and 55 are surface-mounted on principal surface 91*b* of module board 91.

Here, in radio frequency module 1B according to this embodiment, in a plan view of module board 91 (viewed from the z-axis direction), conductive members mounted on principal surface 91*a* are disposed between (i) inductors 31L and 32L and (ii) inductors 41L and 42L. In this embodiment, the conductive members are at least any of duplexers 61 to 64. Further, the conductive members may be at least any of the transmission filters and reception filters in duplexers 61 to 64. The transmission filters and reception filters in duplexers 61 to 64 each have conductive members such as signal extraction electrodes. For example, at least one of the signal extraction electrodes is connected to ground pattern 93G disposed in module board 91.

According to the above configuration, while transmission output matching circuit 30 and reception input matching circuit 40 are disposed on principal surface 91*a* of module board 91, at least one of duplexers 61 to 64 mounted on principal surface 91*a* is disposed between (i) inductors 31L and 32L and (ii) inductors 41L and 42L. At least one of duplexers 61 to 64 can thus block electromagnetic fields generated by inductors 31L and 32L and inductors 41L and 42L to prevent electromagnetic field coupling between (i) inductors 31L and 32L and (ii) inductors 41L and 42L. This can reduce harmonic components of a high-power radio frequency transmission signal amplified by transmission power amplifiers 11 and 12, or intermodulation distortion components between this radio frequency transmission signal and another radio frequency signal, flowing into the reception circuit. Deterioration of the reception sensitivity of radio frequency module 1B can therefore be prevented.

It should be noted that, although radio frequency module 1B according to this embodiment has a configuration in which conductive members mounted on principal surface 91*a* are disposed between (i) inductors 31L and 32L and (ii) inductors 41L and 42L, the conductive members mounted on principal surface 91*a* may be disposed between at least one of inductors 31L and 32L and at least one of inductors 41L and 42L. This can reduce harmonic components of a high-power radio frequency transmission signal transferred through a transmission path, or intermodulation distortion components between this radio frequency transmission signal and another radio frequency signal, flowing into a reception path. Deterioration of the reception sensitivity in the reception path can therefore be prevented. Consequently, deterioration of the reception sensitivity of radio frequency module 18 can be prevented.

In this embodiment, transmission power amplifiers 11 and 12 are mounted on principal surface 91*a*, and reception low-noise amplifiers 21 and 22 are mounted on principal surface 91*b*. Module board 91 is thus interposed between (i) transmission power amplifiers 11 and 12 and (ii) reception low-noise amplifiers 21 and 22, so that radio frequency transmission signals output from transmission power amplifiers 11 and 12 can be prevented from directly flowing into reception low-noise amplifiers 21 and 22. This improves the isolation between the transmission circuit and the reception circuit.

In radio frequency module 1B according to this embodiment, columnar electrodes 150 are disposed on principal surface 91*b* of module board 91. Radio frequency module 1B exchanges, via columnar electrodes 150, electric signals with a mounting board disposed on the z-axis negative direction-side of radio frequency module 1B. Some of columnar electrodes 150 are set to the ground potential of the mounting board. Of principal surfaces 91*a* and 91*b*, principal surface 91*b* facing the mounting board includes reception low-noise amplifiers 21 and 22 and switches 51, 52, and 55, which are easily reduced in profile, but does not include transmission power amplifiers 11 and 12, which are not easily reduced in profile. This enables the profile of entire radio frequency module 1B to be reduced. Columnar electrodes 150 applied as ground electrodes are disposed around reception low-noise amplifiers 21 and 22 that significantly affect the reception sensitivity of the reception circuit, so that deterioration of the reception sensitivity of the reception circuit can be prevented.

Figure 6:
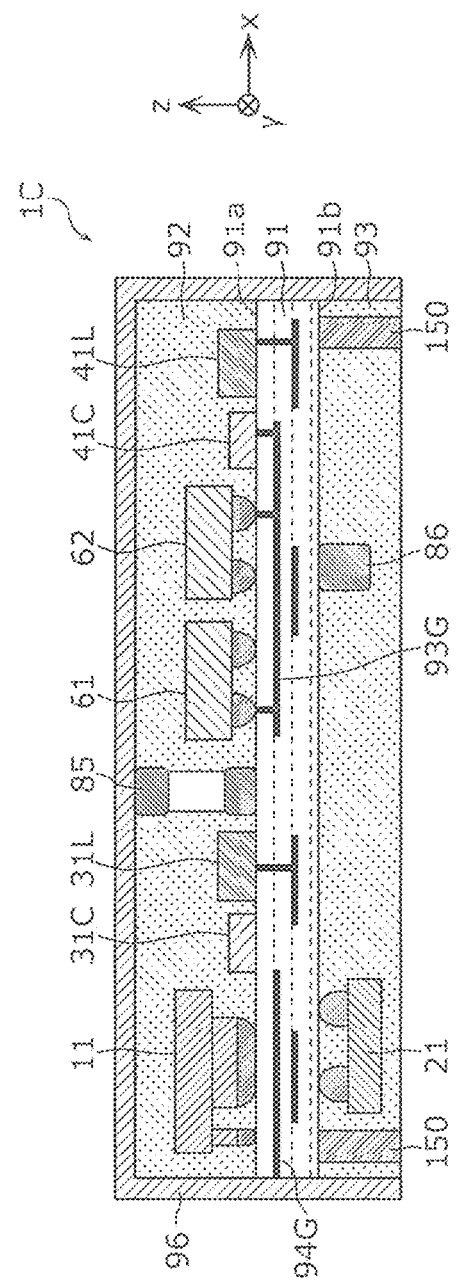
FIG. 6 is a schematic diagram illustrating a cross-sectional configuration of a radio frequency module according to Variation 1 of Embodiment 2.

2.2 Circuit Element Arrangement Configuration of Radio Frequency Module 1C According to Variation FIG. 6 is a schematic diagram illustrating a cross-sectional configuration of radio frequency module 1C according to Variation 1 of Embodiment 2.

Radio frequency module 1C according to this variation is different from radio frequency module 1B according to Embodiment 2 only in that chip capacitors 85 and 86 and shield electrode layer 96 are additionally disposed. Hereinafter, radio frequency module 1C according to this variation will be described mainly for points that are different from radio frequency module 1B according to Embodiment 2, while points that are the same will not be described.

In radio frequency module 1C according to this variation, in a plan view of module board 91 (viewed from the z-axis direction), conductive members mounted on principal surface 91*a* are disposed between inductor 31L and inductor 41L. In this variation, the conductive members are chip capacitor 85 and duplexers 61 to 64.

Shield electrode layer 96 is formed to cover the top and sides of resin member 92 and the sides of resin member 93. Shield electrode layer 96 is connected, on a side of module board 91, to ground pattern 94G in module board 91 set to the ground potential. Providing shield electrode layer 96 can prevent transmission signals from transmission power amplifiers 11 and 12 from being directly emitted outside radio frequency module 1C, and also prevent external noise from being introduced into the circuit elements of radio frequency module 1C. Further, heat-releasing performance is improved because heat generated by transmission power amplifiers 11 and 12 can be released through shield electrode layer 96.

As illustrated in FIG. 6, chip capacitor 85 is oriented such that a line connecting two input-output electrodes is perpendicular to principal surface 91a; one input-output electrode may be connected to principal surface 91a while the other input-output electrode may be connected to shield electrode layer 96. The main body of chip capacitor 85 between the two input-output electrodes may be covered by a shielding conductive film. Chip capacitor 85 may be any chip capacitor included in radio frequency module 1C. For example, chip capacitor 85 may be capacitor 31C in matching circuit 31, or capacitor 41C in matching circuit 41.

As illustrated in FIG. 6, chip capacitor 86 is oriented such that a line connecting two input-output electrodes is parallel to principal surface 91a; the two input-output electrodes are connected to principal surface 91b. The main body of chip capacitor 86 between the two input-output electrodes may be covered by a shielding conductive film. Chip capacitor 86 may be any chip capacitor included in radio frequency module 1C. For example, chip capacitor 86 may be capacitor 32C in matching circuit 32, or capacitor 42C in matching circuit 42.

According to the above configuration, while transmission output matching circuit 30 and reception input matching circuit 40 are disposed on principal surface 91a of module board 91, chip capacitor 85 mounted on principal surface 91a is disposed between inductor 31L and inductor 41L. Chip capacitor 85 can thus block electromagnetic fields generated by inductor 31L and inductor 41L to prevent electromagnetic field coupling between inductor 31L and inductor 41L. This can reduce harmonic components of a high-power radio frequency transmission signal amplified by transmission power amplifier 11, or intermodulation distortion components between this radio frequency transmission signal and another radio frequency signal, flowing into the reception circuit. Deterioration of the reception sensitivity of radio frequency module 1C can therefore be prevented.

In a plan view of module board 91, a chip capacitor mounted on principal surface 91a may be disposed on principal surface 91a between inductor 32L and inductor 42L. The chip capacitor can thus block electromagnetic fields generated by inductor 32L and inductor 42L to prevent electromagnetic field coupling between inductor 32L and inductor 42L. This can reduce harmonic components of a high-power radio frequency transmission signal amplified by transmission power amplifier 12, or intermodulation distortion components between this radio frequency transmission signal and another radio frequency signal, flowing into the reception circuit. Deterioration of the reception sensitivity of radio frequency module 1C can therefore be prevented.

2.3 Circuit Element Arrangement Configuration of Radio Frequency Module 1D

Figure 7A:
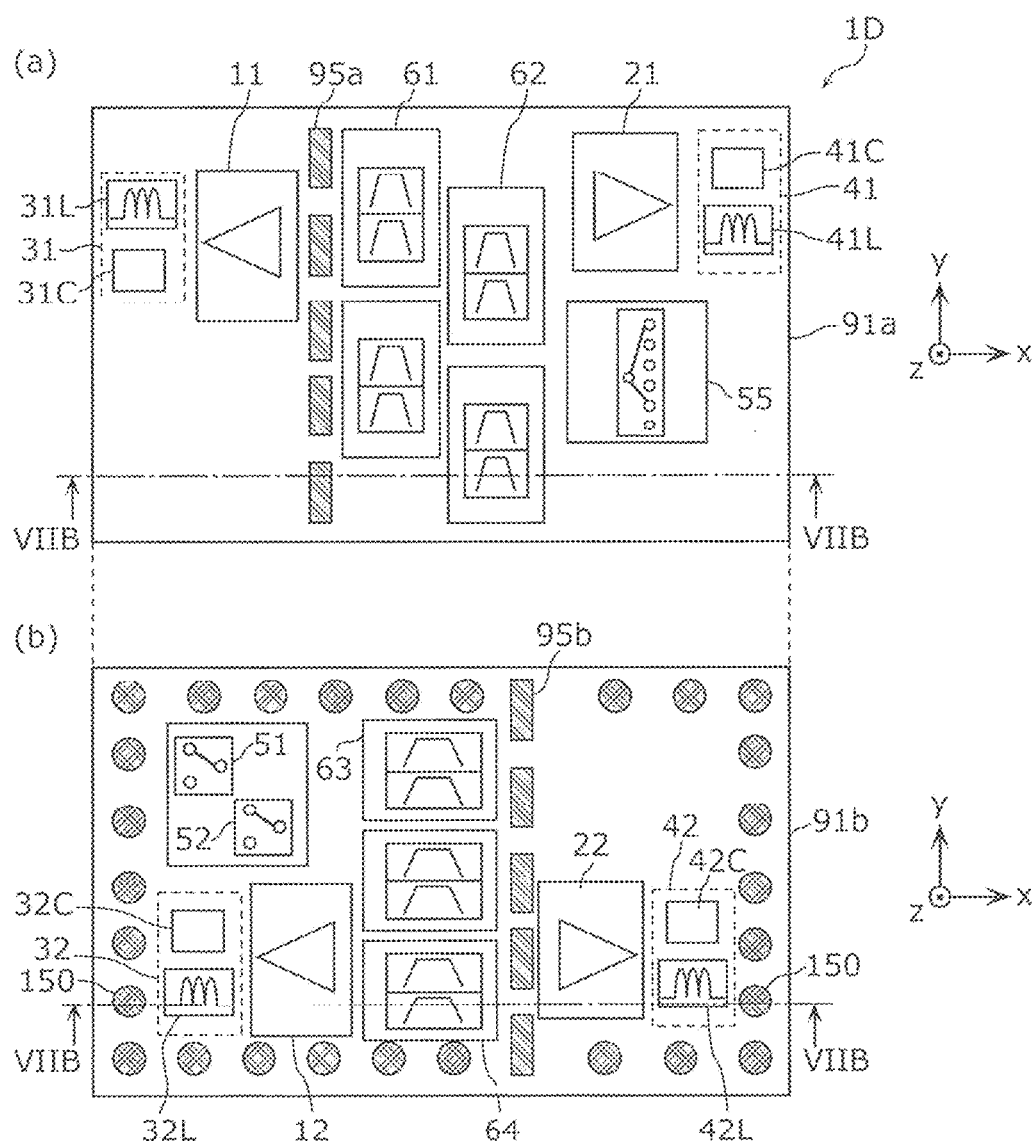
FIG. 7A is a schematic diagram illustrating a plan view configuration of a radio frequency module according to Variation 2 of Embodiment 2.
Figure 7B:
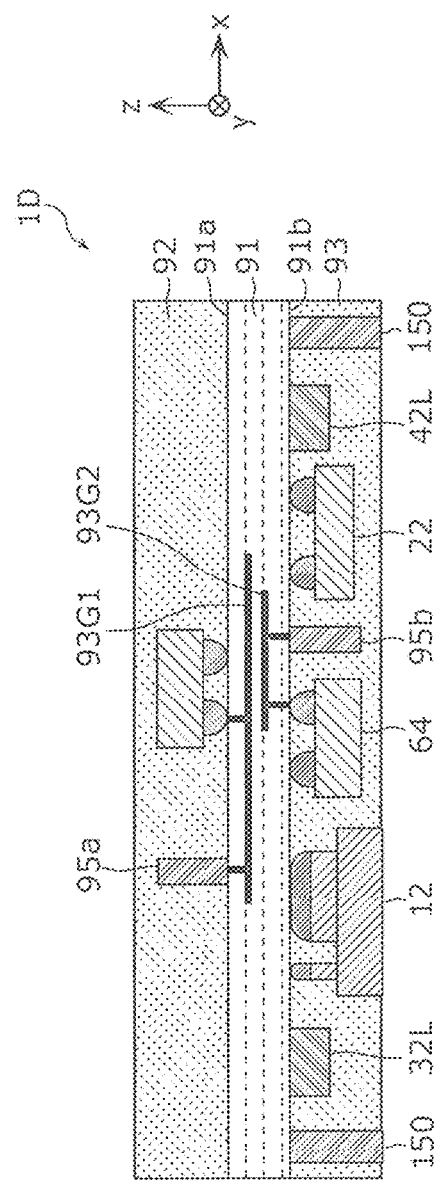
FIG. 7B is a schematic diagram illustrating a cross-sectional configuration of the radio frequency module according to Variation 2 of Embodiment 2.

FIG. 7A is a schematic diagram illustrating a plan view configuration of radio frequency module 1D according to Variation 2 of Embodiment 2. FIG. 7B is a schematic diagram illustrating a cross-sectional configuration of radio frequency module 1D according to Variation 2 of Embodiment 2, and is specifically a cross-sectional view along line VIIB-VIIB in FIG. 7A. It should be noted that (a) in FIG. 7A illustrates a view of the arrangement of circuit elements on principal surface 91a of principal surfaces 91a and 91b on the opposite sides of module board 91, viewed from the y-axis positive direction-side. By contrast, (b) in FIG. 7A illustrates a see-through view of the arrangement of circuit elements on principal surface 91b viewed from the y-axis positive direction-side.

As illustrated in FIGS. 7A and 7B, radio frequency module 1D according to this variation further includes module board 91, resin members 92 and 93, and metal chips 95a and 95b, in addition to the circuit configuration illustrated in FIG. 1. Radio frequency module 1D according to this variation is different from radio frequency module 1B according to Embodiment 2 in that metal chips 95a and 95b are additionally disposed, and in how the circuit elements of radio frequency module 1D are divided between principal surfaces 91a and 91b. Hereinafter, radio frequency module 1D according to this variation will be described mainly for points that are different from radio frequency module 1B according to Embodiment 2, while points that are the same will not be described.

As illustrated in FIGS. 7A and 7B, in radio frequency module 1D according to this variation, transmission power amplifier 11, reception low-noise amplifier 21, duplexers 61 and 62, matching circuits 31 and 41, switch 55, and metal chips 95a are surface-mounted on principal surface 91a of module board 91. On the other hand, transmission power amplifier 12, reception low-noise amplifier 22, duplexers 63 and 64, matching circuits 32 and 42, switches 51 and 52, and metal chips 95b are surface-mounted on principal surface 91b of module board 91.

That is, in radio frequency module 1D according to this variation, principal surface 91a has mounted thereon the first transmission circuit including transmission path AT for communication band A and transmission path BT for communication band B, and the first reception circuit including reception path AR for communication band A and reception path BR for communication band B. On the other hand, principal surface 91b has mounted thereon the second transmission circuit including transmission path CT for communication band C and transmission path DT for communication band D, and the second reception circuit including reception path CR for communication band C and reception path DR for communication band D.

Here, in radio frequency module 1D according to this variation, in a plan view of module board 91 (viewed from the z-axis direction), conductive members mounted on principal surface 91a are disposed between inductor 31L and inductor 41L, and conductive members mounted on principal surface 91b are disposed between inductor 32L and inductor 42L. In this embodiment, the conductive members are metal chips 95a and 95b.

As illustrated in FIG. 7B, each of metal chips 95a is connected to ground pattern 93G1 disposed in module board 91, and each of metal chips 95b is connected to ground pattern 93G2 disposed in module board 91.

According to the above configuration, metal chips 95a can block electromagnetic fields generated by inductor 31L and inductor 41L, and metal chips 95b can block electromagnetic fields generated by inductor 32L and inductor 42L. Therefore, electromagnetic field coupling between inductor 31L and inductor 41L and electromagnetic field coupling between inductor 32L and inductor 42L can be prevented. This can reduce harmonic components of a high-power radio frequency transmission signal amplified by transmission power amplifiers 11 and 12, or intermodulation distortion components of this radio frequency transmission signal and another radio frequency signal, flowing into the reception circuits. Deterioration of the reception sensitivity of radio frequency module 1D can therefore be prevented.

It should be noted that, although duplexers 61 and 62 are disposed between inductor 31L and inductor 41L in addition to metal chips 95a mounted on principal surface 91a in this variation, duplexers 61 and 62 need not be disposed between inductor 31L and inductor 41L in this variation. It should also be noted that, although duplexers 63 and 64 are disposed between inductor 32L and inductor 42L in addition to metal chips 95b mounted on principal surface 91b, duplexers 63 and 64 need not be disposed between inductor 32L and inductor 42L in this variation. This is because metal chips 95a have the function of blocking electromagnetic fields generated by inductors 31L and 41L, and metal chips 95b have the function of blocking electromagnetic fields generated by inductors 32L and 42L.

In radio frequency module 1D according to this variation, the first transmission and reception circuits that propagate radio frequency signals of the first frequency band group and the second transmission and reception circuits that propagate radio frequency signals of the second frequency band group are mounted on the opposite sides of module board 91. Consequently, in performing CA of a radio frequency signal of the first frequency band group and a radio frequency signal of the second frequency band group, module board 91 can reduce mutual interference between the two radio frequency signals. This improves the isolation between the first transmission and reception circuits and the second transmission and reception circuits.

Although this embodiment and the variations thereof have illustrated the duplexers, chip capacitors, and the metal chips as conductive members disposed between (i) inductors 31L and 32L and (ii) inductors 41L and 42L, the conductive members may also be any of (1) switch 55, (2) switch 51 or 52, (3) switch 53 or 54, (4) a diplexer (multiplexer) disposed between (i) common terminal 100 and (ii) the transmission filters and the reception filters, and (5) a control circuit that generates at least one of a control signal for adjusting the gains of transmission power amplifiers 11 and 12 and reception low-noise amplifiers 21 and 22, and a control signal for controlling the switching of switches 51 to 56.

The control circuit in above (5) may be a switch IC that includes at least one of switches 51 to 56.

The circuit elements in above (1) to (5) desirably have an electrode set to a ground potential or a fixed potential. For example, the circuit elements in above (1) to (5) are desirably connected to a ground pattern formed in module board 91. This improves the electromagnetic field blocking function of the circuit elements in above (1) to (5).

With the conductive members illustrated above, electromagnetic fields generated by inductors 31L and 32L and inductors 41L and 42L can be blocked to prevent electromagnetic field coupling between (i) inductors 31L and 32L and (ii) inductors 41L and 42L. This can reduce harmonic components of a high-power radio frequency transmission signal amplified by transmission power amplifier 11 and 12, or intermodulation distortion components of this radio frequency transmission signal and another radio frequency signal, flowing into the reception circuits. Deterioration of the reception sensitivity of the radio frequency module can therefore be prevented.

The radio frequency module according to this embodiment and the variations thereof have the conductive members mounted on module board 91 between (i) inductors 31L and 32L and (ii) inductors 41L and 42L. Alternatively, the radio frequency modifies according to this embodiment and the variations thereof may have the following configuration.

That is, as illustrated in FIG. 4 presented in Embodiment 1, in a plan view of module board 91, principal surfaces 91a and 91b are rectangular, and one of principal surfaces 91a and 91b with at least one of matching circuits 31, 32, 41, and 42 has central region C that includes at least one of transmission filters 61T to 64T and reception filters 61R to 64R, and peripheral region P that excludes central region C. Peripheral region P further has four outer side regions PU, PD, PL, and PR that include four outer sides U, D, L, and R, respectively, of the principal surface. Here, in a plan view of module board 91, at least one of inductors 31L and 32L and at least one of inductors 41L and 42L are disposed in two outer side regions PL and PR, respectively, located on opposite sides of central region C, or in two outer side regions PU and PD, respectively, located on opposite sides of central region C.

According to the above configuration, inductors 31L and 32L and inductors 41L and 42L are distributed in outer side regions located on opposite sides of central region C that includes at least any of the transmission filters and the reception filters. Inductors 31L and 32L and inductors 41L and 42L are thus spaced apart from each other in a plan view of module board 91, so that it is possible to reduce the extent to which electromagnetic fields generated by inductors 31L and 32L reach inductors 41L and 42L. This can reduce harmonic components of a high-power radio frequency transmission signal amplified by transmission power amplifier 11 and 12, or intermodulation distortion components of this radio frequency transmission signal and another radio frequency signal, flowing into the reception circuits. Deterioration of the reception sensitivity of the radio frequency module according to this embodiment and the variations thereof can therefore be prevented.

Other Embodiments

Although radio frequency modules and communication devices according to the present disclosure have been described above based on exemplary embodiments and variations thereof, the radio frequency circuit and communication device according to the present disclosure are not limited to the foregoing embodiments and variations. The present disclosure also encompasses other embodiments achieved by combining arbitrary elements in the above embodiments and variations thereof, variations resulting from various modifications to the embodiments and variations thereof that may be conceived by those skilled in the art without departing from the essence of the present disclosure, and various devices that include the radio frequency module and communication device according to the present disclosure.

For example, in the radio frequency modules and communication devices according to the foregoing exemplary embodiments and variations thereof, another circuit element and line may be inserted in a path connecting respective circuit elements and signal paths disclosed in the drawings.

INDUSTRIAL APPLICABILITY

The present disclosure can be widely used in communication apparatuses such as a mobile phone, as a radio frequency module provided in a multiband-compatible front-end unit.

The invention claimed is:

1. A radio frequency module, comprising:
a module board including a first principal surface and a second principal surface on opposite sides of the module board;
a first transmission power amplifier configured to amplify a radio frequency transmission signal;
a transmission output matching circuit connected to an output terminal of the first transmission power amplifier;
a first reception low-noise amplifier configured to amplify a radio frequency reception signal; and
a reception input matching circuit connected to an input terminal of the first reception low-noise amplifier, wherein
the transmission output matching circuit includes a first inductance element mounted on the first principal surface,
the reception input matching circuit includes a second inductance element mounted on the first principal surface,
in a plan view of the module board, a conductive member mounted on the first principal surface is disposed between the first inductance element and the second inductance element, and
the first transmission power amplifier and the first reception low-noise amplifier are mounted on a same principal surface of the module board.

2. The radio frequency module according to claim 1, further comprising:
a common terminal;
a first transmission filter disposed in a transmission path connecting the first transmission power amplifier and the common terminal, and configured to pass a radio frequency transmission signal of a predetermined transmission band out of the radio frequency transmission signal amplified by the first transmission power amplifier; and
a first reception filter disposed in a reception path connecting the first reception low-noise amplifier and the common terminal, and configured to pass a radio frequency reception signal of a predetermined reception band out of a radio frequency reception signal input from the common terminal, wherein
the transmission output matching circuit is disposed in the transmission path between the first transmission power amplifier and the first transmission filter, and is configured to match impedances of the first transmission power amplifier and the first transmission filter, and
the reception input matching circuit is disposed in the reception path between the first reception low-noise amplifier and the first reception filter, and is configured to match impedances of the first reception low-noise amplifier and the first reception filter.

3. The radio frequency module according to claim 2, wherein
the conductive member is any one of:
(1) a first switch configured to switch between conduction and non-conduction between the transmission path and the common terminal and conduction and non-conduction between the reception path and the common terminal;
(2) a second switch configured to switch conduction and non-conduction between the transmission path and the first transmission power amplifier;
(3) a third switch configured to switch conduction and non-conduction between the reception path and the first reception low-noise amplifier;
(4) the first transmission filter;
(5) the first reception filter;
(6) a multiplexer disposed between (i) the common terminal and (ii) the first transmission filter and the first reception filter;
(7) a metal chip;
(8) a chip capacitor;
(9) a control circuit configured to generate at least one of a control signal for adjusting a gain of the first transmission power amplifier and a gain of the first reception low-noise amplifier or a control signal for controlling switching of the first switch, the second switch, and the third switch.

4. The radio frequency module according to claim 2, wherein
the predetermined transmission band is a transmission band of a first communication band,
the predetermined reception band is a reception band of the first communication band,
the first transmission power amplifier is configured to preferentially amplify a radio frequency transmission signal of the transmission band of the first communication band,
the first reception low-noise amplifier is configured to preferentially amplify a radio frequency reception signal of the reception band of the first communication band,
the first transmission filter and the first reception filter constitute a duplexer that supports the first communication band, and
the conductive member is at least one of the first transmission filter or the first reception filter.

5. The radio frequency module according to claim 2, wherein
the predetermined transmission band is a transmission band of a first communication band,
the predetermined reception band is a reception band of a second communication band different from the first communication band,
the first transmission power amplifier is configured to preferentially amplify a radio frequency transmission signal of the transmission band of the first communication band,
the first reception low-noise amplifier is configured to preferentially amplify a radio frequency reception signal of the reception band of the second communication band,
the radio frequency module further comprises:
a second transmission power amplifier configured to preferentially amplify a radio frequency transmission signal of a transmission band of the second communication band;
a second transmission filter disposed in a transmission path connecting the second transmission power amplifier and the common terminal, and configured to pass the radio frequency transmission signal of the transmission band of the second communication band out of a radio frequency transmission signal amplified by the second transmission power amplifier;
a second reception low-noise amplifier configured to preferentially amplify a radio frequency reception signal of a reception band of the first communication band; and a second reception filter disposed in a reception path connecting the second reception low-noise amplifier and the common terminal, and configured to pass the radio frequency reception signal of the reception band of the first communication band out of a radio frequency reception signal input from the common terminal, and the conductive member is at least one of the first transmission filter, the second transmission filter, the first reception filter, or the second reception filter.

6. The radio-frequency module according to claim 5, wherein transmission of a radio frequency transmission signal of the first communication band and reception of a radio frequency reception signal of the second communication band are executed simultaneously.

7. The radio-frequency module according to claim 2, wherein a frequency of a harmonic of the radio frequency transmission signal amplified by the first transmission power amplifier or a frequency of intermodulation distortion between the radio frequency transmission signal and another radio frequency signal overlaps at least part of the predetermined reception band.

8. The radio-frequency module according to claim 1, wherein the conductive member includes an electrode that is grounded via the first principal surface.

9. The radio-frequency module according to claim 1, wherein in the plan view of the module board, at least part of a region of the conductive member projected in the plan view overlaps a line connecting an arbitrary point in a region of the first inductance element projected in the plan view and an arbitrary point in a region of the second inductance element projected in the plan view.

10. A communication device, comprising:

an RF signal processing circuit configured to process a radio frequency signal which is transmitted or received by an antenna element; and the radio frequency module according to claim 1 configured to propagate the radio frequency signal between the antenna element and the RF signal processing circuit.

11. A radio-frequency module, comprising:

a module board including a first principal surface and a second principal surface that are opposite each other, the first principal surface being rectangular shaped;

a first transmission power amplifier configured to amplify a radio frequency transmission signal;

a first transmission filter disposed in a transmission path including the first transmission power amplifier, and configured to pass a radio frequency transmission signal of a predetermined transmission band out of the radio frequency transmission signal amplified by the first transmission power amplifier;

a transmission output matching circuit disposed in the transmission path between the first transmission power amplifier and the first transmission filter, and configured to match impedances of the first transmission power amplifier and the first transmission filter;

a first reception low-noise amplifier configured to amplify a radio frequency reception signal;

a first reception filter disposed in a reception path including the first reception low-noise amplifier, and configured to pass a radio frequency reception signal of a predetermined reception band out of a radio frequency reception signal; and a reception input matching circuit disposed in the reception path between the first reception low-noise amplifier and the first reception filter, and configured to match impedances of the first reception low-noise amplifier and the first reception filter, wherein the transmission output matching circuit includes a first inductance element mounted on the first principal surface, the reception input matching circuit includes a second inductance element mounted on the first principal surface, in the plan view of the first principal surface, the first principal surface includes a central region and four outer side regions including four outer sides of the first principal surface other than the central region, the central region containing at least one of the first transmission filter or the first reception filter, in the plan view of the first principal surface, the first inductance element and the second inductance element are each disposed in a different one of two outer side regions out of the four outer side regions, the two outer side regions being located on opposite sides of the central region.

* * * * *